United States Patent
Kadosh et al.

(10) Patent No.: US 6,589,847 B1
(45) Date of Patent: Jul. 8, 2003

(54) TILTED COUNTER-DOPED IMPLANT TO SHARPEN HALO PROFILE

(75) Inventors: Daniel Kadosh, Austin, TX (US); Scott D. Luning, Austin, TX (US); Derick J. Wristers, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/631,557

(22) Filed: Aug. 3, 2000

(51) Int. Cl.⁷ .......................................... H01L 21/336
(52) U.S. Cl. .................... 438/302; 438/305; 438/525; 438/301
(58) Field of Search ................ 438/302, 305, 438/306, 307, 525, 527, 301, 289, 291

(56) References Cited

U.S. PATENT DOCUMENTS

| | | | | |
|---|---|---|---|---|
| 4,771,012 A | * | 9/1988 | Yabu et al. | 438/302 |
| 5,426,063 A | * | 6/1995 | Kaneko et al. | 438/302 |
| 5,825,066 A | * | 10/1998 | Buynoski | 257/345 |
| 5,849,615 A | * | 12/1998 | Ahmad et al. | 438/302 |
| 5,937,293 A | * | 8/1999 | Lee | 438/306 |
| 6,133,082 A | * | 10/2000 | Masuoka | 438/199 |
| 6,236,085 B1 | * | 5/2002 | Kawaguchi et al. | 257/347 |

FOREIGN PATENT DOCUMENTS

| JP | 4-10-012747 A | * | 1/1998 |
|---|---|---|---|

* cited by examiner

*Primary Examiner*—Michael Trinh
(74) *Attorney, Agent, or Firm*—Williams, Morgan & Amerson, P.C.

(57) ABSTRACT

The present invention is directed to a method of forming halo implant regions in a semiconductor device. In one illustrative embodiment, the method comprises forming a gate electrode above a semiconducting substrate, the substrate being doped with a first type of dopant material, and forming halo implant regions in the substrate adjacent the gate electrode by performing at least the following steps: performing a first angled implant process using a dopant material that is of a type opposite to the first type of dopant material and performing a second angled implant using a dopant material that is of the same type as the first type of dopant material. The method concludes with performing at least one additional implantation process to further form source/drain regions for the device.

80 Claims, 7 Drawing Sheets

TILTED COUNTER-DOPED IMPLANT TO SHARPEN HALO PROFILE

BACKGROUND OF THE INVENTION

1. Field of the Invention

This invention relates generally to semiconductor fabrication technology, and, more particularly, to a method of forming halo implants in a substrate adjacent a gate structure of a transistor.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the channel length of a transistor also increases "short-channel" effects, almost by definition. Short-channel effects include, among other things, an increased drain-source leakage current when the transistor is supposed to be switched "off." This is a result of, at least in part, the source/drain depletion regions being closer together because of the shorter channel length. Short-channel effects also include "threshold voltage roll-off" (i.e., the threshold voltage ($V_{th}$) decreases as gate length is reduced), and the like.

In general, short-channel effects may be reduced by using angled halo implants. Angled halo implants are implants of dopants that effectively "reinforce" the doping type of the substrate in the channel between the source/drain extension regions (formerly known as lightly doped drain or LDD regions). For example, for an NMOS transistor, the doping type of the substrate in the channel between the N-type source/drain extension regions is a P-type dopant, e.g., boron (B) or boron difluoride ($BF_2$). In this illustrative example, the halo implant process involves the use of P-type dopants implanted into the substrate at an angle (with respect to a direction perpendicular to the surface of the substrate), and with a dose that may range from about $1.0 \times 10^{12}$ to $1.0 \times 10^{14}$ ions/cm$^2$ at an implant energy ranging from about 5–15 keV for boron and about 20–70 keV for boron difluoride.

Similarly, for a PMOS transistor, the doping type of the substrate in the channel between the P-type source/drain extension regions is an N-type dopant, e.g., arsenic or phosphorous. For example, an angled halo implant comprised of arsenic (As) may be implanted into the substrate at an angle (with respect to a direction perpendicular to the surface of the substrate), and with a dose that may range from about $1.0 \times 10^{12}$ to $1.0 \times 10^{14}$ ions/cm$^2$ at an implant energy ranging from about 40–70 keV for arsenic.

Figure 1:
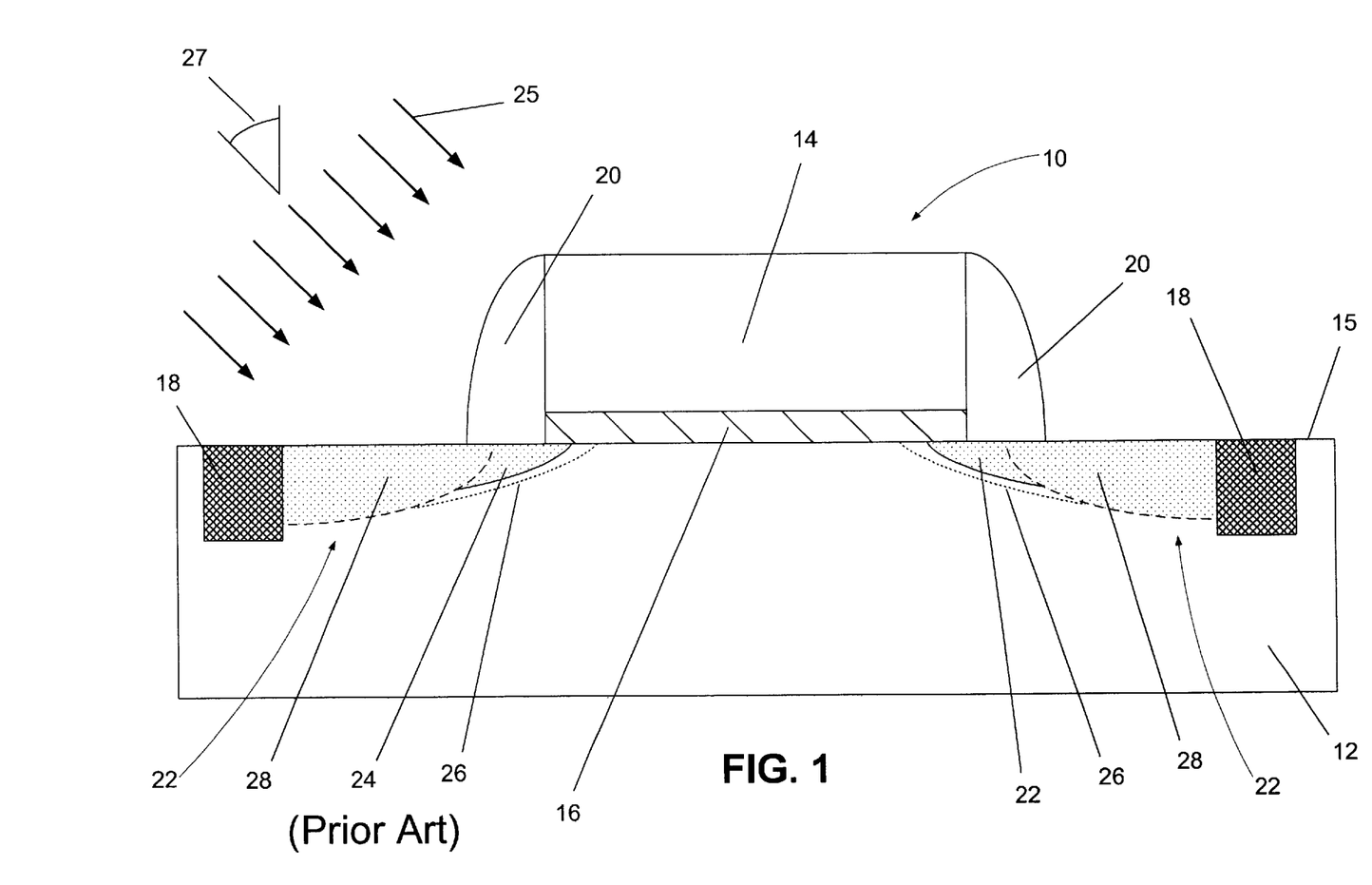
FIG. 1 is a cross-sectional view of an illustrative transistor in which halo implants are formed in the device using an illustrative prior art process flow.

As shown in FIG. 1, for example, an illustrative field effect transistor 10 may be formed above a semiconducting substrate 12, such as doped-silicon. The substrate 12 may be doped with either N-type or P-type dopant materials. The transistor 10 may have a doped-polycrystalline silicon (doped-polysilicon or doped-poly) gate electrode 14 formed above a gate insulation layer 16 that is formed above the surface 15 of the semiconducting substrate 12. The gate electrode 14 and the gate insulation layer 16 may be separated from doped source/drain regions 22 of the transistor 10 by dielectric sidewall spacers 20. The sidewall spacers 20 may be formed above shallow source/drain extension regions 24. Shallow trench isolation regions 18 may be provided to isolate the transistor 10 electrically from neighboring semiconductor devices such as other transistors (not shown).

A typical prior art process flow to produce the structure depicted in FIG. 1 will now be described. Initially, the trench isolations 18 are formed in the substrate 12. Thereafter, the gate insulation layer 16 and the gate electrode 14 are formed by forming the appropriate layers of material above the substrate 12, and thereafter patterning those layers by performing one or more etching processes to define the gate electrode 14 and the gate insulation layer 16. Next, the halo implant regions 26 are formed. In particular, a halo implant process 25 is initially performed on one side of the device. Upon completion, the device may be rotated 180° and the halo implant process 25 may then be repeated to form a halo implant region 26 on the opposite side. In practice, the device 10 may be subjected to four halo implants during processing. Four implants are typically performed because many of the transistors formed above a substrate are oriented approximately 90° relative to one another.

Thereafter, a source/drain extension implant (not shown) is performed to form the source/drain extension regions 24. Note that, the implant process is typically self-aligned with respect to the gate electrode although some small amount of scattering may occur. Thereafter, sidewall spacers 20 are formed adjacent the gate electrode 14. Then, a source/drain implant (not shown) is performed to form the doped region 28. This source/drain implant is generally aligned with respect to the sidewall spacers 20. Lastly, one or more anneal processes are performed to activate the implanted dopant atoms and to repair damage to the lattice structure of the substrate 12. During these anneal processes, the implanted dopant materials migrate, or diffuse, from their implanted location in a more or less isotropic fashion. The post-anneal position of the various doped regions is depicted approximately in FIG. 1.

As shown in the illustrative NMOS device depicted in FIG. 1, P$^-$-doped regions 26 resulting from angled halo implants are typically provided adjacent the N-doped source/drain extension regions 24 to reduce some of the short-channel effects described above. In particular, by "reinforcing" the P-doping type of the semiconducting substrate 12 in the channel between the N-doped source/drain extension regions 24, the laterally non-uniform P$^-$-doped angled halo implant regions 26 may be better at controlling the threshold roll-off (i.e., the threshold voltage ($V_{th}$) decreasing as gate length is reduced), thereby reducing short-channel induced effects such as a non-zero drain-source leakage current when the transistor is supposed to be switched "off," (i.e., "off-state" leakage).

The angle 27 of the halo dopant implant 25 with respect to a line perpendicular to the surface 15 of the semiconducting substrate 12 may normally lie within a range of about 0°–60°. Typically, the semiconducting substrate 12 is tilted at the angle 27 with respect to a horizontal direction in an implanter (not shown) and the halo dopant is directed downward in a vertical direction. Alternatively, the semiconducting substrate 12 could be disposed in the horizontal direction in the implanter (not shown) and the halo dopant implant could be directed downward at the angle 27 with respect to the horizontal direction in the implanter, and/or any other combination of tilt and implant direction could be used as long as the angle 27 is the relative angle of the halo implant with respect to a line perpendicular to the surface 15 of the semiconducting substrate 12.

The halo dopants are implanted into and/or through a region of the substrate 12 that will eventually become the N-doped source/drain extension regions 24 of the device and the N⁺-doped regions 28. However, the dosage of the halo dopant atoms is typically at least an order of magnitude less than the dosage of dopant for the N-doped source/drain extension regions 24 and the doped regions 28. Similarly, the halo dopant atoms may also be implanted into the doped-poly gate electrode 14 and/or the gate insulation layer 16. However, the doping of the doped-poly gate electrode 14 also typically overwhelms the halo dopant atoms in the gate electrode 14. Furthermore, the amount of the halo dopant atoms in the gate insulation layer 16 is typically miniscule.

Typically, the dopant concentration used during the halo implant process may range from approximately $1.0 \times 10^{12}$ to $1.0 \times 10^{14}$ ions/cm² of the appropriate dopant atoms, e.g., boron (B) or boron difluoride ($BF_2$) for an illustrative NMOS transistor (the P-type halo implant serving to reinforce the P-type doping of the channel region of the NMOS transistor), or arsenic (As) or phosphorus (P) for an illustrative PMOS transistor (the N-type halo implant serving to reinforce the N-type doping of the channel region of the PMOS transistor). An implant energy of the halo dopant atoms and/or molecules may range from approximately 5–70 keV.

However, as feature sizes continue to decrease, i.e., as the channel length of transistors continue to decrease, the above-described technique for forming halo implants is not as effective in reducing the hot carrier effects in modern semiconductor devices. This, in turn, results in poor device performance and/or more waste as more and more devices do not meet performance standards required of modern semiconductor devices.

The present invention is directed to solving, or at least reducing, some or all of the aforementioned problems.

SUMMARY OF THE INVENTION

The present invention is directed to a method of forming halo implant regions in a semiconductor device. In one illustrative embodiment, the method comprises forming a gate electrode above a semiconducting substrate, the substrate being doped with a first type of dopant material, and forming halo implant regions in the substrate adjacent the gate electrode by performing at least the following steps: performing a first angled implant process using a dopant material that is of a type opposite to the first type of dopant material and performing a second angled implant using a dopant material that is of the same type as the first type of dopant material. The method concludes with performing at least one additional implantation process to further form source/drain regions for the device.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–7. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to a method of forming halo implants in semiconductor devices. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Figure 2:
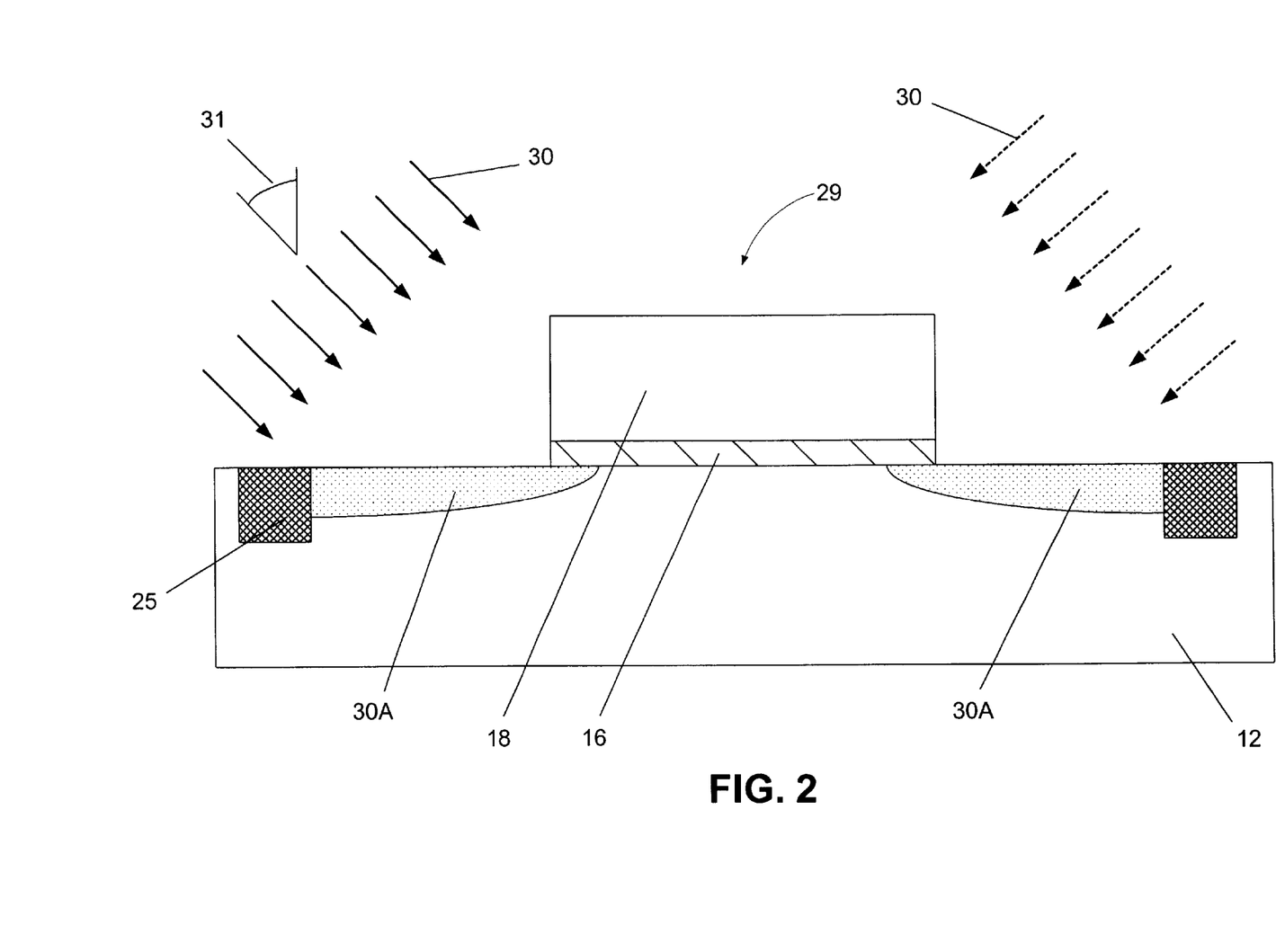
FIG. 2 is a cross-sectional view of an illustrative, partially formed transistor after an initial halo implant process is performed using a dopant material that is the same type as the dopant used in the substrate.

FIG. 2 depicts a partially formed semiconductor device 29, e.g., a transistor, comprised of a gate electrode 18 and gate insulation layer 16. In general, the particular materials and techniques used to form the various components or layers of the transistor 29 depicted in FIG. 2, e.g., the gate insulation layer 16 and the gate electrode 18, are matters of design choice, and, thus, should not be considered a limitation of the present invention. For example, the gate insulation layer 16 may be comprised of silicon dioxide, and it may be formed by, for example, a thermal growth process or a deposition process. Similarly, the gate electrode 18 may be comprised of polysilicon, and it may be formed by, for example, a physical vapor deposition ("PVD") or a chemical vapor deposition ("CVD") process. In one illustrative embodiment, the gate electrode 18 is comprised of a layer of polysilicon having a thickness ranging from approximately 1000–4000 Å that is formed by a CVD process.

The substrate 12 may be comprised of a variety of semiconducting materials, such as silicon. The substrate 12 will typically be doped with either an N-type or P-type dopant, depending upon the intended use for the substrate. For example, for NMOS technology, the substrate 12 may be doped with a P-type dopant such as boron or the like. For PMOS technology, the substrate 12 may be doped with an N-type dopant such as arsenic, phosphorous, or the like. It should be noted that the present invention may also be used in CMOS devices in which localized pockets or wells of dopants are formed in the substrate 12 that are of the opposite type to that of the nominal substrate 12. For example, many localized N-type doped regions may be formed in a substrate 12 doped with P-type dopants. Thus, during subsequent processing, a PMOS device may be formed in the area defined by those N-type doped wells, and NMOS devices may be formed in the nominal P-type doped substrate 12.

As an overview, the present invention involves performing two halo ion implantation processes 30, 32 (described more fully below) to form the halo implant regions of the completed device. That is, in contrast to prior art process flows wherein the halo implant region is formed by a single ion implantation process, the present invention uses two halo implant processes in which the first halo implant process is performed using a dopant material that is of a different type than the dopant material of the substrate. Illustrative parameters for these implant processes are set forth more fully below. After the two implant processes 30, 32 are performed, a source/drain extension implant 36 and a source/drain implant 38 are performed to further form the final source/drain regions of the device.

As shown in FIG. 2, a first halo implant 30 is performed to form doped regions 30A in the substrate 12. The first halo implant process 30 is typically performed after the formation of the gate insulation layer 16 and the gate electrode 14. This first halo implant process 30 may be performed using a dopant type that is of an opposite type to the dopant type of the substrate 12. That is, if the substrate 12 is doped P-type, the dopant material implanted during the first halo implant process 30 will be an N-type dopant. Similarly, if the substrate 12 is an N-type substrate, the dopant material implanted during the first halo implant process 30 will be a P-type dopant. This is in contrast to prior art halo implant processes where the halo implant process was comprised of a dopant material that was the same dopant type as that of the substrate 12. By performing an initial halo implant process 30 using dopant atoms that are of the opposite dopant type as compared to that of the doped substrate, halo implants with sharper profiles may be formed thereby helping to reduce short-channel effects in modern devices.

A variety of dopant materials may be used during the first halo implant process 30. For example, N-type dopant materials such as arsenic or phosphorous may be used where appropriate (NMOS devices), and P-type dopant materials such as boron or boron difluoride may be used in PMOS devices. The concentration of dopant atoms performed during this first halo implant process 30 may range from approximately $1 \times 10^{12}$ to $5 \times 10^{13}$ ions/cm$^2$. The implant process may be performed at a variety of angles relative to the surface of the substrate 12 ranging from approximately 0–60 degrees. As noted earlier, this may be accomplished by maintaining the substrate approximately horizontal and moving the implant source relative to the substrate, or by tilting the substrate relative to the ion implant source. Multiple implant processes 30 will typically be performed on the device to complete the formation of the halo implant regions 30A. For example, the halo implant process 30 will typically be performed on one side of the device (e.g., the left side in FIG. 2) and, thereafter, the process will be performed three more times as the device is rotated approximately 90 degrees each time. Thus, the arrows for the implant 30 on the right side of FIG. 2 are dashed, indicating that the implant process 30 on the right side of the device 29 is performed after the implant process 30 is performed on the left side of the device. Please note that for any individual device, only two of the halo implant processes need to be performed. The device 29 will typically be subjected to four halo implant processes 30 because there are many transistors formed above the substrate 12 that are oriented 90° with respect to one another.

Of course, the implant energy used during this implant process 30 will vary depending upon the dopant material used during the process. For example, where the device 29 is comprised of an NMOS device, with a P-type doped substrate 12, the dopant material implanted in the first implant process 30 may be comprised of arsenic at a dopant concentration ranging from approximately $1 \times 10^{12}$ to $5 \times 10^{13}$ ions/cm$^2$ that is performed at an energy level ranging from approximately 10–40 keV at a relative angle ranging from approximately 0°–60° relative to a line perpendicular to the surface of the substrate 12.

Figure 3:
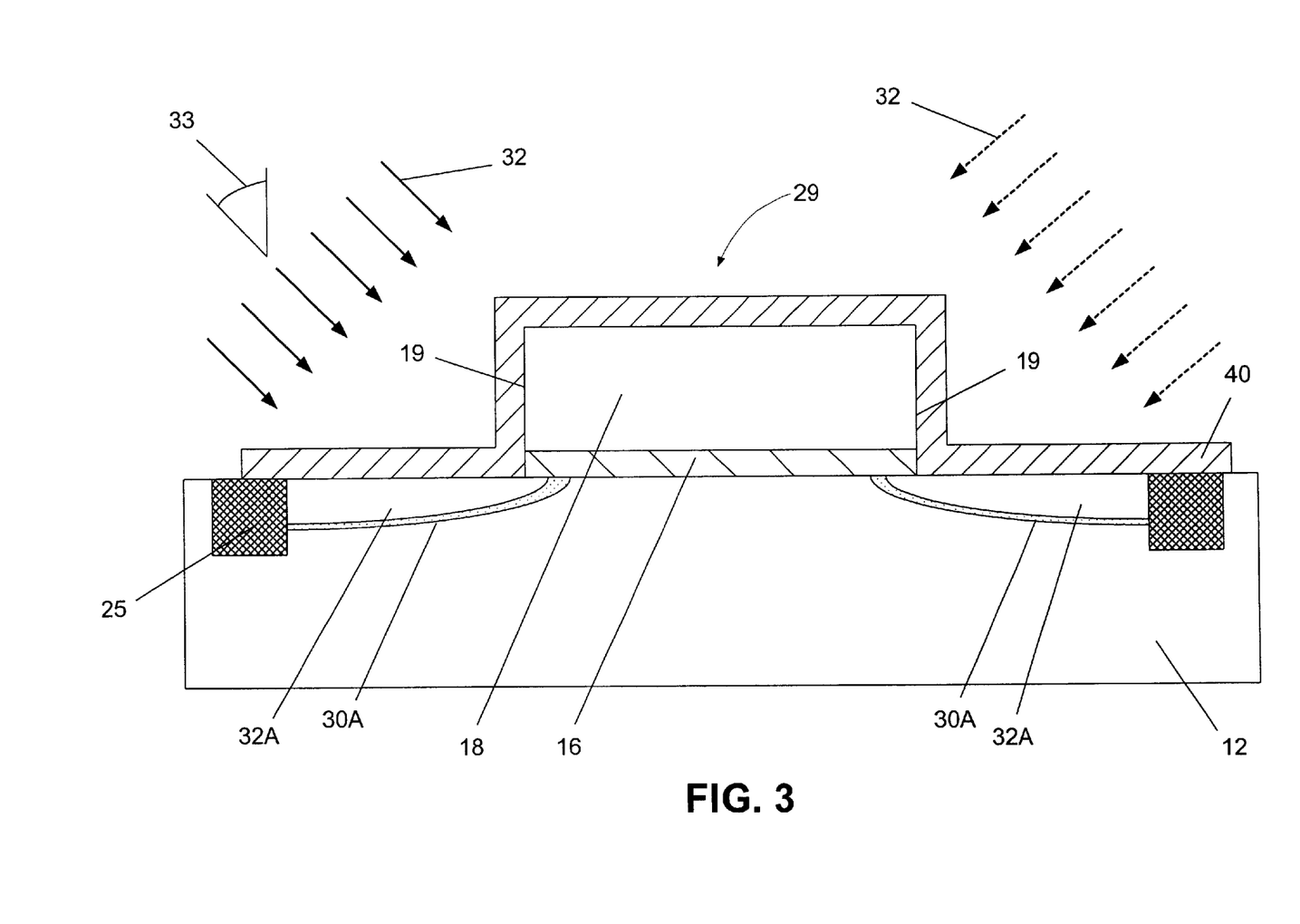
FIG. 3 is a cross-sectional view of the device shown in FIG. 2 after a second halo implant process is performed using a dopant atom that is the opposite of the dopant type of the substrate.

Next, as shown in FIG. 3, an optional process layer 40 may be formed on the device 29. The process layer 40 may be comprised of a variety of materials, such as silicon dioxide, an oxynitride, a nitride, silicon oxynitride, silicon nitride, etc., and it may be formed by a variety of techniques, e.g., a thermal growth process, physical vapor deposition (PVD), chemical vapor deposition (CVD), etc., and it may have a thickness ranging from approximately 40–300 Å. In one illustrative embodiment, the process layer 40 is comprised of a thermally grown layer of silicon dioxide having a thickness ranging from approximately 40–300 Å. As stated previously, the process layer 40 may or may not be used for the present invention, and it may or may not be sacrificial in nature. Thus, the formation of process layer 40 should not be considered a limitation of the present invention unless it is specifically set forth in the appended claims.

Then, as indicated in FIG. 3, a second halo implant process 32 may be performed to form doped regions 32A. This second halo implant process 32 is typically the same as the single halo implant process used in prior art process flows. The dopant material used in the second halo implant process 32 will be of the same type as the dopant type of the substrate 12. That is, for an illustrative NMOS device, where the substrate is doped with a P-type dopant, the dopant atoms implanted during the second halo implant process 32 will be a P-type dopant, e.g., boron, boron difluoride, etc. Similarly, for a PMOS device, where the substrate is doped with an N-type dopant, the dopant material implanted during the second halo ion implantation process 32 will be an N-type dopant, e.g., arsenic, phosphorous, etc. The angle at which the second halo implant process 32 is performed may vary from approximately 0°–60° relative to a line perpendicular to the surface of the substrate 12. In one particular embodiment, the angle may vary from approximately 45°–60°. The concentration of the dopant atoms used during the second halo implant process 32 may vary from approximately $1 \times 10^{12}$ to $5 \times 10^{13}$ ions/cm$^2$. The energy used during the second ion implantation process 32 will vary depending upon the dopant materials used during this process and depending on the thickness of the layer 40. In one illustrative embodiment, for an NMOS device, the second halo implant process 32 is performed using boron at a concentration ranging from approximately $1 \times 10^{12}$ to $5 \times 10^{13}$ ions/cm$^2$ that is implanted with an energy ranging from approximately 5–70 keV and at a relative angle 33 ranging from approximately 0°–60°.

As stated previously, the use of the process layer 40 is optional, and its use may depend on the particular device under construction. The process layer 40 may be used to limit the extent to which the doped regions 32A formed during the second halo implant process 32 extend under the edge 19 of the gate electrode 18, i.e., it may be used to laterally offset the doped region 32A formed during the second halo implant process 32 from the doped regions 30A formed during the first halo implant process 30. However, this process layer 40 may not be used in all process flows. For example, in situations where the angle 31 of the first halo implant process 30 is greater than the angle 33 of the second halo implant process 32, then the process layer 40 may not be required, as the difference in the implant angles 31, 33 may also help in providing the lateral offset between the two doped regions 30A, 32A formed during these halo implant processes. Of course, if desired, the process layer 40 may be used even in situations where the angle 31 of the first halo implant process 30 is greater than the angle 33 of the second halo implant process 32. Thus, the use of such a process layer 40 should not be considered a limitation of the present invention unless specifically set forth in the appended claims.

Figure 4:
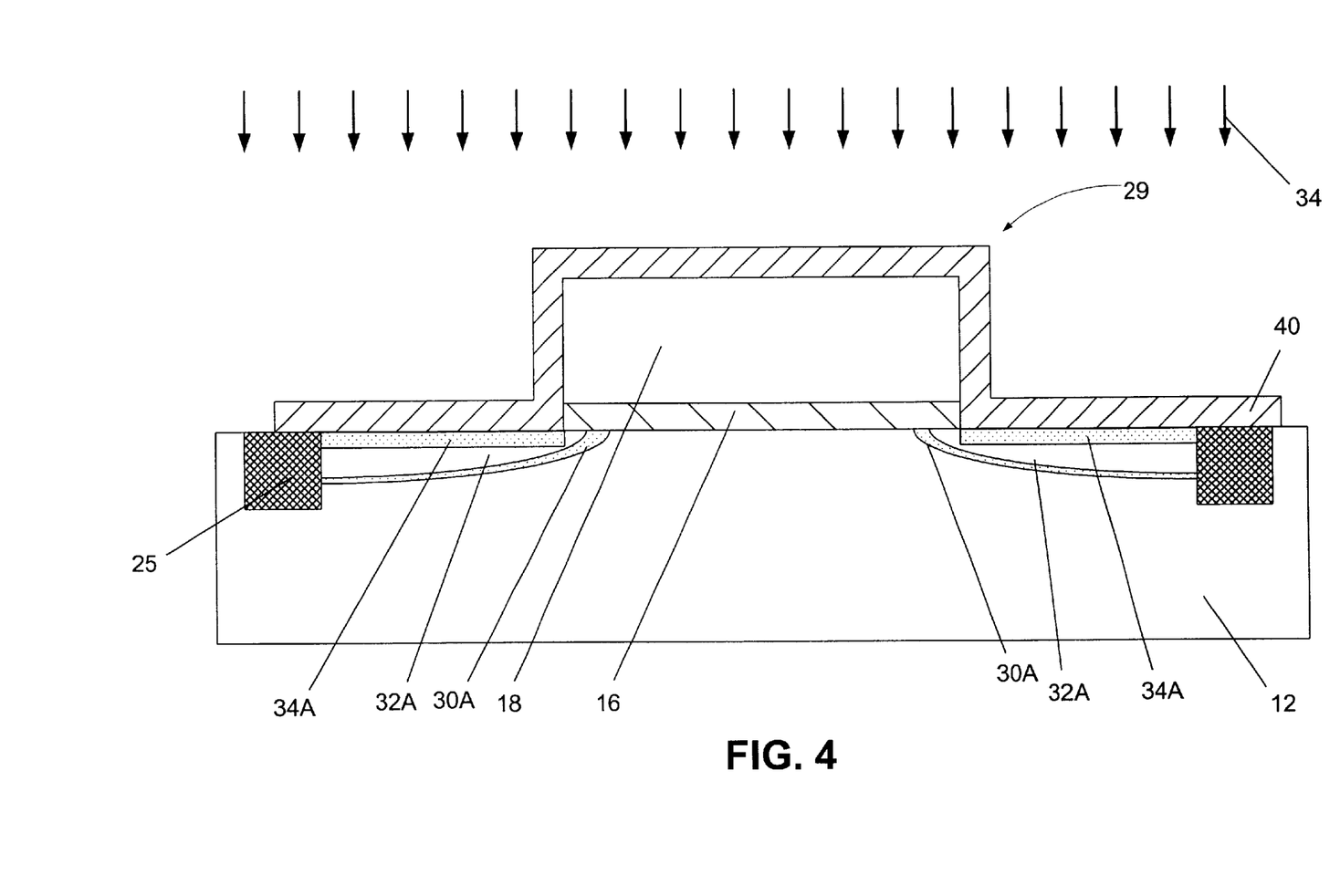
FIG. 4 is a cross-sectional view of the device shown in FIG. 3 after a source/drain extension implant has been performed on the device.

As indicated in FIG. 4, a source/drain extension ion implantation process, as indicated by arrows 34, is performed on the device to form doped regions 34A in the semi-conducting substrate adjacent the gate electrode 18. This ion implantation process 34 is used to form the source/drain extensions of the completed device. The concentration of dopant atoms used in the source/drain extension ion implantation process 34 may vary from approximately $1 \times 10^{14}$ to $5 \times 10^{15}$ ions/cm$^2$ of the appropriate dopant atoms, e.g., arsenic (As) or phosphorous (P) for NMOS technology, boron (B) or boron difluoride (BF$_2$) for PMOS technology, etc. The energy level for the ion implantation process 34 will vary depending upon the dopant material used in the process. For example, in one illustrative embodiment for forming the source/drain extension implants in an NMOS device, the source/drain extension ion implantation process 34 is performed using arsenic as the dopant atoms at a concentration ranging from approximately $1 \times 10^{14}$ to $5 \times 10^{15}$ ions/cm$^2$ and at an energy level ranging from approximately 1–20 keV.

Figure 5:
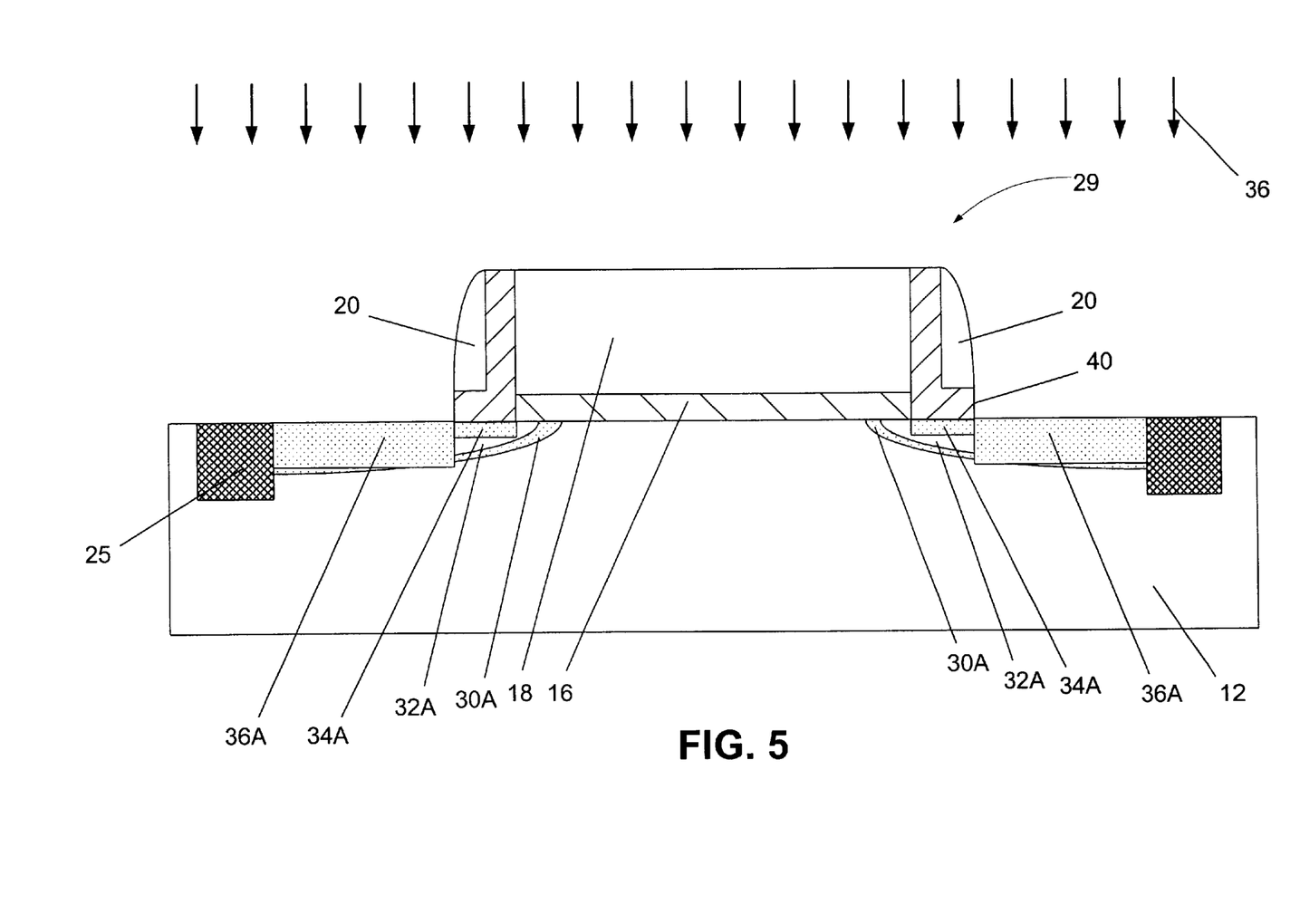
FIG. 5 is a cross-sectional view of the device shown in FIG. 4 after sidewall spacers have been formed adjacent the gate electrode and a source/drain implant process has been performed on the device.

Next, as indicated in FIG. 5, a plurality of sidewall spacers 20 may be formed adjacent the process layer 40 and the gate electrode 18. The sidewall spacers 20 are formed by depositing a layer of spacer material above the surface of the device and thereafter performing an anisotropic etching process to define the spacer 20. The layer of spacer material may be comprised of a variety of materials, such as silicon dioxide, silicon oxynitride, or other like materials. Moreover, it may be formed by any of a variety of techniques for forming such layers, such as chemical vapor deposition (CVD), physical vapor deposition (PVD), etc.

Thereafter, as indicated in FIG. 5, an ion implantation process 36 is performed to form the doped regions 36A in the substrate. Note that the ion implantation process 36 is generally self-aligned with respect to the sidewall spacers 20. Moreover, this ion implantation process 36 is normally considered to be the source/drain implant in modern semiconductor manufacturing operations. For example, the concentration of dopant atoms in the ion implantation process 36 may vary from approximately $5 \times 10^{14}$ to $5 \times 10^{15}$ ions/cm$^2$ of the appropriate dopant atoms, e.g., arsenic or phosphorous for NMOS technology, boron for PMOS technology, etc. The energy level for the ion implantation process 36 will vary depending upon the dopant material. For example, in one illustrative embodiment for forming the source/drain regions in an NMOS device, the ion implantation process 36 is performed using arsenic as the dopant atoms at a concentration of approximately $5 \times 10^{14}$ to $5 \times 10^{15}$ ions/cm$^2$ and at an energy level ranging from approximately 20 keV to 40 keV.

Figure 6:
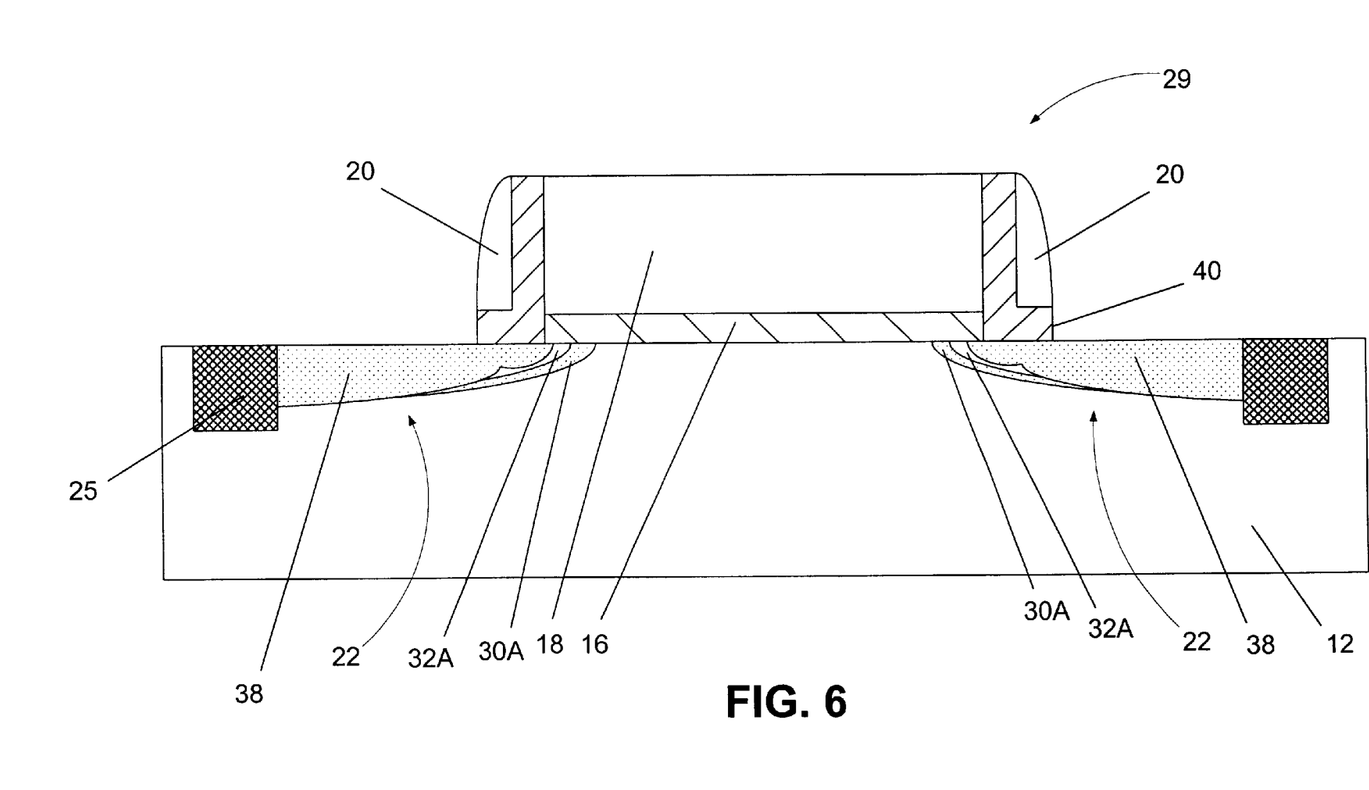
FIG. 6 is a cross-sectional view of the device shown in FIG. 5 after it has been subjected to one or more anneal processes.

Next, as shown in FIG. 6, the device is subjected to one or more thermal anneal processes whereby the dopant atoms introduced into the substrate 12 during the various ion implantation processes described above are activated and damage to the lattice structure of the semiconducting substrate 12 resulting from the ion implantation processes is repaired. Note that during this process, the previously implanted dopant atoms migrate, or move, from their original implanted position. This migration of the dopant atoms is generally isotropic in direction. Also note that during this process the doped regions 34A and 36A may merge together to form the completed source/drain regions 22 of the device.

Figure 7:
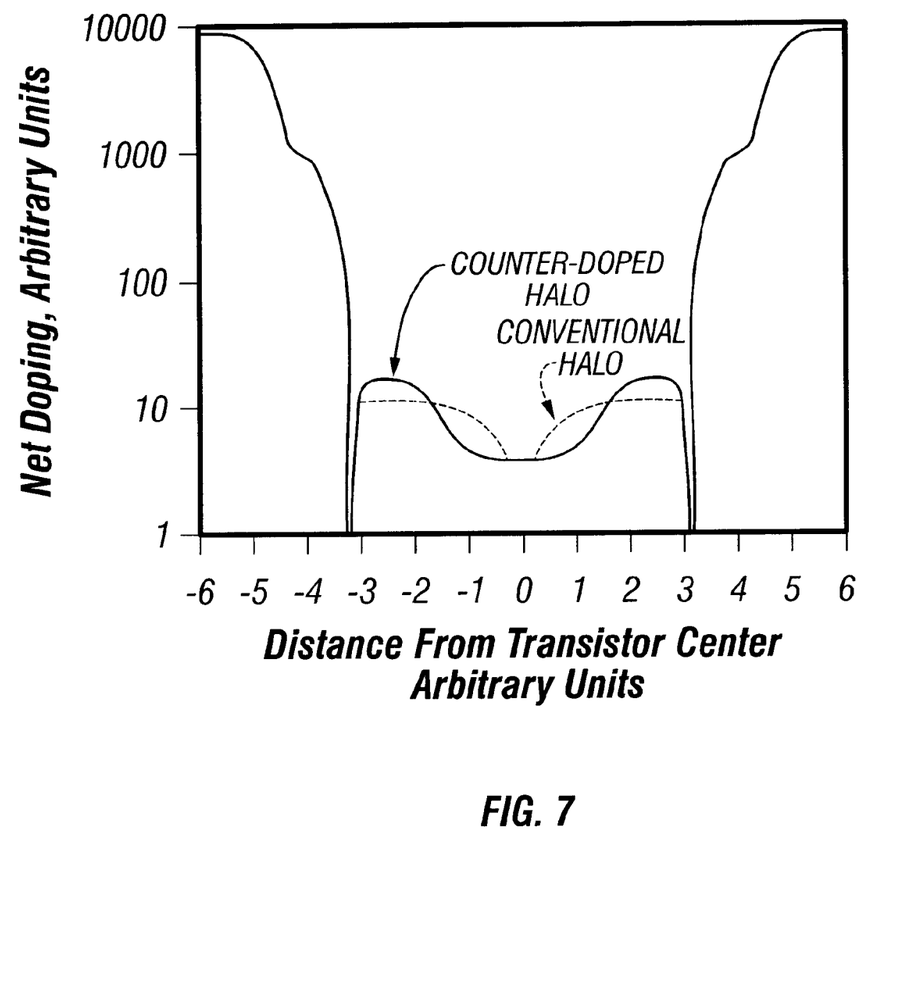
FIG. 7 is a graph comparing the present technique for forming halo implants to prior art techniques for forming halo implants.

FIG. 7 is a graph that is an approximation of the net-doping differences that result from use of the two-step, counter-doped halo implant process described herein as compared to the device fabricated using a traditional single halo implant process. The vertical axis of the chart is net doping, that is, the absolute value of the N-type doping minus P-type doping for an illustrative NMOS device. The region between −6 and −3 is the N-type source. Between −3 and +3 is the channel region of the transistor. The region to the right of +3 is an N-type drain. Note that the two-step, counter-doped halo implant process exhibits having a sharp halo profile that is better contained, that is, not in the center of the channel. The increased profile sharpness leads to much better voltage roll-off characteristics, such that voltage is more constant as the gate length is shrunk, leading to less process variability.

Although the various implant regions 30A, 32A, 34A and 36A are depicted in the drawings as having very precise and distinct boundaries, in practice at least portions of these regions will tend to merge together as a result of the implant processes and/or subsequent anneal processes performed on the device. Nevertheless, the drawings indicate these regions as being very precise and defined for purposes of explaining the present invention.

Moreover, although the present invention has been described in the context whereby the dopant atoms used during the various implantation processes 30, 34 and 36 are all the same, e.g, arsenic, the present invention should not be considered so limited. That is, as will be understood by those skilled in the art after a complete reading of the present application, various combinations of the appropriate type dopant atoms may be used with the present invention. For example, the implants 30, 34 may be performed using arsenic, whereas the implant 36 may be performed using phosphorous. As another example, the first implant 30 may be performed using phosphorous, and the implant processes 32, 36 may be performed using arsenic. Other combinations are, of course, possible. Thus, the particular dopant atoms used in performing the present invention should not be considered a limitation of the present invention unless it is specifically set forth in the appended claims.

As stated previously, the energy levels of the various halo implant processes 30, 32 will vary depending upon the dopant materials used during these processes. The illustrative energy levels used in the halo implant process 30, 32 described herein for implanting arsenic in an illustrative NMOS device would need to be scaled based upon the dopant atoms used, while maintaining the approximate dopant concentration levels described herein, at least for the two halo implants 30, 32.

The various energy level ranges described herein were provided for the situation where arsenic was used as the dopant atoms in an NMOS device. Arsenic has an atomic weight of approximately 75. Other possible dopant materials, such as phosphorous, boron, and boron difluoride, have typical atomic weights of approximately 31, 11 and 49, respectively. When using these dopant materials, the various energy levels disclosed herein would have to be scaled accordingly. For example, using phosphorous as the dopant atoms, given its lower atomic weight relative to arsenic, the energy levels described above would need to be reduced by the ratio of approximately 11/75. The following table indicates illustrative energy values for use with various dopant atoms during the fast halo implant process 30.

| Dopant Atoms | Typical Approximate Atomic Weight | First Halo Implant Approximate Energy Level |
| --- | --- | --- |
| Arsenic | 75 | 10–40 keV |
| Phosphorous | 31 | 4–20 keV |
| Boron | 11 | 1.5–6 keV |
| Boron difluoride | 49 | 6–26 keV |

Through use of the present invention, semiconductor devices may be formed that reduce threshold voltage roll-off characteristics and improve control of short-channel effects. Moreover, devices fabricated in accordance with the present invention may exhibit lower leakage currents than prior art devices. This in turn will lead to devices with enhanced performance capability and the performance of integrated circuit devices comprised of such semiconductor devices will be improved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming source/drain regions in a semiconductor device, comprising:

forming a gate electrode above a semiconducting substrate, said substrate being doped with a first type of dopant material;

forming halo implant regions in said substrate adjacent said gate electrode by performing at least the following steps:

performing a first angled implant process at an angle greater than zero but less than approximately 60 degrees using a dopant material that is of a type opposite to said first type of dopant material to form a first halo implant region comprised of said opposite type of dopant material in said substrate;

performing a second angled implant process at an angle greater than zero but less than approximately 60 degrees using a dopant material that is of the same type as said first type of dopant material to form a second halo implant region comprised of said same type of dopant material in said substrate within said first halo implant region; and performing at least one additional implantation process to further form source/drain regions for the device.

2. The method of claim 1, wherein said substrate is doped with a P-type dopant material, said first angled implant process is performed using an N-type dopant material, and said second angled implant process is performed using a P-type dopant material.

3. The method of claim 1, wherein said substrate is doped with a P-type dopant material comprised of at least one of boron and boron difluoride, said first angled implant process is performed using an N-type dopant material comprised of at least one of arsenic and phosphorous, and said second angled implant process is performed using a P-type dopant material comprised of at least one of boron and boron difluoride.

4. The method of claim 1, wherein said substrate is doped with an N-type dopant material, said first angled implant process is performed using a P-type dopant material, and said second angled implant process is performed using an N-type dopant material.

5. The method of claim 1, wherein said substrate is doped with an N-type dopant material comprised of at least one of arsenic and phosphorous, said first angled implant process is performed using a P-type dopant material comprised of at least one of boron and boron difluoride, and said second angled implant process is performed using an N-type dopant material comprised of at least one of arsenic and phosphorous.

6. The method of claim 1, wherein performing a first angled implant process using a dopant material that is of a type opposite to said first type of dopant material comprises performing a first angled implant process at an angle ranging from approximately 15–60 degrees using a dopant material that is of a type opposite to said first type of dopant material.

7. The method of claim 1, wherein performing a second angled implant process using a dopant material that is of the same type as said first type of dopant material comprises performing a second angled implant process at an angle ranging from approximately 15–60 degrees using a dopant material that is of the same type as said first type of dopant material.

8. The method of claim 1, wherein performing a first angled implant process using a dopant material that is of a type opposite to said first type of dopant material comprises performing a first angled implant process using a dopant material that is of a type opposite to said first type of dopant material and implanted at a concentration level of approximately $1 \times 10^{12}$ to $5 \times 10^{13}$ ions/cm$^2$.

9. The method of claim 1, wherein performing a second angled implant process using a dopant material that is of the same type as said first type of dopant material comprises performing a second angled implant process using a dopant material that is of the same type as said first type of dopant material and implanted at a concentration level of approximately $1 \times 10^{12}$ to $5 \times 10^{13}$ ions/cm$^2$.

10. The method of claim 1, wherein performing a first angled implant process using a dopant material that is of a type opposite to said first type of dopant material comprises performing a first angled implant process using a dopant material that is of a type opposite to said first type of dopant material and implanted at a concentration level of approximately $1 \times 10^{12}$ to $5 \times 10^{13}$ ions/cm$^2$ and at an energy level ranging from approximately 5–40 keV.

11. The method of claim 1, wherein performing at least one additional implantation process to further form source/drain regions for the device comprises:

performing a third implant process to form source/drain extensions for the device; and performing a fourth implant process to further form source/drain regions in said device.

12. The method of claim 1, wherein performing at least one additional implantation process to further form source/drain regions for the device comprises:

performing a third implant process at a dopant concentration ranging from approximately $1 \times 10^{14}$ to $5 \times 10^{15}$ ions/cm$^2$ to form source/drain extensions for the device; and performing a fourth implant process at a dopant concentration ranging from approximately $5 \times 10^{14}$ to $5 \times 10^{15}$ ions/cm$^2$ to further form source/drain regions in said device.

13. The method of claim 1, further comprising performing at least one anneal process to activate the dopant material implanted during at least said first and second implant processes.

14. The method of claim 1, further comprising forming a process layer above said gate electrode and said substrate after said first implant process, said second implant process being performed after said process layer is formed.

15. The method of claim 1, further comprising thermally growing a process layer comprised of silicon dioxide above said gate electrode and said substrate after said first implant process, said second implant process being performed after said process layer is formed.

16. The method of claim 2, wherein said substrate is doped with a P-type dopant material comprised of at least one of boron and boron difluoride, said first angled implant process is performed using an N-type dopant material comprised of at least one of arsenic and phosphorous, and said second angled implant process is performed using a P-type dopant material comprised of at least one of boron and boron difluoride.

17. The method of claim 2, wherein performing a first angled implant process using an N-type dopant material comprises performing a first angled implant process at an angle ranging from approximately 15–60 degrees using an N-type dopant material.

18. The method of claim 2, wherein performing a second angled implant process using a P-type dopant material comprises performing a second angled implant process at an angle ranging from approximately 15–60 degrees using a P-type dopant material.

19. The method of claim 2, wherein performing a first angled implant process using an N-type dopant comprises performing a first angled implant process using an N,type dopant material at a concentration ranging from approximately $1 \times 10^{12}$ to $5 \times 10^{13}$ ions/cm$^2$.

20. The method of claim 2, wherein performing a second angled implant process using a P-type dopant material comprises performing a second angled implant process using a P-type dopant material at a concentration ranging from approximately $1 \times 10^{12}$ to $5 \times 10^{13}$ ions/cm $^2$.

21. The method of claim 2, wherein performing a first angled implant process using an N-type dopant comprises performing a first angled implant process using an N-type dopant material comprised of arsenic at a concentration ranging from approximately $1 \times 10^{12}$ to $5 \times 10^{13}$ ions/cm$^2$ and at an energy level ranging from approximately 5–70 keV.

22. The method of claim 21, wherein performing a second angled implant process using a P-type dopant material comprises performing a second angled implant process using a P-type dopant material comprised of boron at a concentration ranging from approximately $1 \times 10^{12}$ to $5 \times 10^{13}$ ions/cm$^2$ and at an energy level ranging from approximately 2–70 keV.

23. The method of claim 2, wherein performing at least one additional implantation process to further form source/drain regions for the device comprises:

performing a third implant process to form source/drain extensions for the device; and performing a fourth implant process to further form source/drain regions in said device.

24. The method of claim 2, wherein performing at least one additional implantation process to further form source/drain regions for the device comprises:

performing a third implant process at a dopant concentration ranging from approximately $1 \times 10^{14}$ to $5 \times 10^{15}$ ions/cm$^2$ to form source/drain extensions for the device; and performing a fourth implant process at a dopant concentration ranging from approximately $5 \times 10^{14}$ to $5 \times 10^{15}$ ions/cm$^2$ to further form source/drain regions in said device.

25. The method of claim 2, further comprising performing at least one anneal process to activate the dopant material implanted during at least said first and second implant processes.

26. The method of claim 2, further comprising forming a process layer above said gate electrode and said substrate after said first implant process, said second implant process being performed after said process layer is formed.

27. The method of claim 2, further comprising thermally growing a process layer comprised of silicon dioxide above said gate electrode and said substrate after said first implant process, said second implant process being performed after said process layer is formed.

28. The method of claim 4, wherein said substrate is doped with an N-type dopant material comprised of at least one of arsenic and phosphorous, said first angled implant process is performed using a P-type dopant material comprised of at least one of boron and boron difluoride, and said second angled implant process is performed using an N-type dopant material comprised of at least one of arsenic and phosphorous.

29. The method of claim 4, wherein performing a first angled implant process using a P-type dopant material comprises performing a first angled implant process at an angle ranging from approximately 15–60 degrees using a P-type dopant material.

30. The method of claim 4, wherein performing a second angled implant process using an N-type dopant material comprises performing a second angled implant process at an angle from approximately 15–60 degrees using an N-type dopant material.

31. The method of claim 4, wherein performing a first angled implant process using a P-type dopant material comprises performing a first angled implant process using a P-type dopant material at a concentration ranging from approximately $1 \times 10^{12}$ to $5 \times 10^{13}$ ions/cm².

32. The method of claim 4, wherein performing a second angled implant process using an N-type dopant material comprises performing a second angled implant process using an N-type dopant material at a concentration ranging from approximately $1 \times 10^{12}$ to $5 \times 10^{13}$ ions/cm².

33. The method of claim 4, wherein performing a first angled implant process using a P-type dopant material comprises performing a first angled implant process using a P-type dopant material comprised of boron at a concentration ranging from approximately $1 \times 10^{12}$ to $5 \times 10^{13}$ ions/cm² and at an energy level ranging from approximately 1.5–5.9 keV.

34. The method of claim 4, wherein performing a second angled implant process using an N-type dopant material comprises performing a second angled implant process using an N-type dopant material comprised of arsenic at a concentration ranging from approximately $1 \times 10^{12}$ to $5 \times 10^{13}$ ions/cm² and at an energy level ranging from approximately 5–70 kev.

35. The method of claim 4, wherein performing at least one additional implantation process to further form source/drain regions for the device comprises:
   performing a third implant process to form source/drain extensions for the device; and
   performing a fourth implant process to further form source/drain regions in said device.

36. The method of claim 4, wherein performing at least one additional implantation process to further form source/drain regions for the device comprises:
   performing a third implant process at a dopant concentration ranging from approximately $1 \times 10^{14}$ to $5 \times 10^{15}$ ions/cm² to form source/drain extensions for; the device; and
   performing a fourth implant process at a dopant concentration ranging from approximately $5 \times 10^{14}$ to $5 \times 10^{15}$ ions/cm² to further form source/drain regions in said device.

37. The method of claim 4, further comprising performing at least one anneal process to activate the dopant material implanted during at least said first and second implant processes.

38. The method of claim 4, further comprising forming a process layer above said gate electrode and said substrate after said first implant process, said second implant process being performed after said process layer is formed.

39. The method of claim 4, further comprising thermally growing a process layer comprised of silicon dioxide above said gate electrode and said substrate after said first implant process, said second implant process being performed after said process layer is formed.

40. A method of forming source/drain regions in an NMOS semiconductor device, comprising:
   forming a gate electrode above a semiconducting substrate, said substrate being doped with at least one of boron and boron difluoride;
   forming halo implant regions in said substrate adjacent said gate electrode by performing at least the following steps:
      performing a first angled implant process at an angle greater than zero but less than approximately 60 degrees using at least one of arsenic and phosphorous to form a first halo implant region comprised of at least one of arsenic and phosphorous in said substrate;
      performing a second angled implant process at an angle greater than zero but less than approximately 60 degrees using at least one of boron and boron difluoride to form a second halo implant region comprised of at least one of boron and boron difluoride in said substrate within said first halo implant region; and
   performing at least one additional implantation process to further form source/drain regions for the device.

41. The method of claim 40, wherein said first angled implant process is performed at an angle ranging from approximately 15–60 degrees.

42. The method of claim 40, wherein said second angled implant process is performed at an angle ranging from approximately 15–60 degrees.

43. The method of claim 40, wherein said first angled implant process is performed at an angle greater than zero but less than 60 degrees and at a concentration ranging from approximately $1 \times 10^{12}$ to $5 \times 10^{13}$ ions/cm².

44. The method of claim 40, wherein said second angled implant process is performed at an angle greater than zero but less than 45 degrees and at a concentration ranging from approximately $1 \times 10^{12}$ to $5 \times 10^{13}$ ions/cm².

45. The method of claim 40, wherein performing at least one additional implantation process to further form source/drain regions for the device comprises:
   performing a third implant process to form source/drain extensions for the device; and
   performing a fourth implant process to further form source/drain regions in said device.

46. The method of claim 40, wherein performing at least one additional implantation process to further form source/drain regions for the device comprises:
   performing a third implant process at a dopant concentration ranging from approximately $1 \times 10^{14}$ to $5 \times 10^{15}$ ions/cm² to form source/drain extensions for the device; and
   performing a fourth implant process at a dopant concentration ranging from approximately $5 \times 10^{14}$ to $5 \times 10^{15}$ ions/cm to further form source/drain regions, in said device.

47. The method of claim 40, further comprising performing at least one anneal process to activate the dopant material implanted during at least said first and second implant processes.

48. The method of claim 40, further comprising forming a process layer above said gate electrode and said substrate after said first implant process, said second implant process being performed after said process layer is formed.

49. The method of claim 40, further comprising thermally growing a process layer comprised of silicon dioxide above said gate electrode and said substrate after said first implant process, said second implant process being performed after said process layer is formed.

50. A method of forming source/drain regions in a PMOS semiconductor device, comprising:
   forming a gate electrode above a semiconducting substrate, said substrate being doped with at least one of arsenic and phosphorous;
   forming halo implant regions in said substrate adjacent said gate electrode by performing at least the following steps:

performing a first angled implant process at an angle greater than zero but less than approximately 60 degrees using at least one of boron and boron difluoride to form a first halo implant region comprised of at least one of boron and boron difluoride in said substrate;

performing a second angled implant process at an angle greater than zero but less than approximately 60 degrees using at least one of arsenic and phosphorous to form a second halo implant region comprised of at least one of arsenic and phosphorous in said substrate within said first implant doped region; and performing at least one additional implantation process to further form source/drain regions for the device.

51. The method of claim 50, wherein said first angled implant process is performed at an angle ranging from approximately 15–60 degrees.

52. The method of claim 50, wherein said second angled implant process is performed at an angle ranging from approximately 15–60 degrees.

53. The method of claim 50, wherein said first angled implant process is performed at an angle greater than zero but less than 60 degrees and at a concentration ranging from approximately $1 \times 10^{12}$ to $5 \times 10^{13}$ ions/cm$^2$.

54. The method of claim 50, wherein said second angled implant process is performed at an angle greater than zero but less than 45 degrees and at a concentration ranging from approximately $1 \times 10^{12}$ to $5 \times 10^{13}$ ions/cm$^2$.

55. The method of claim 50, wherein performing at least one additional implantation process to further form source/drain regions for the device comprises:

performing a third implant process to form source/drain extensions for the device; and performing a fourth implant process to further form source/drain regions in said device.

56. The method of claim 50, wherein performing at least one additional implantation process to farther form source/drain regions for the device comprises:

performing a third implant process at a dopant concentration ranging from approximately $1 \times 10^{14}$ to $5 \times 10^{15}$ ions/cm$^2$ to form source/drain extensions for the device; and performing a fourth implant process at a dopant concentration ranging from approximately $5 \times 10^{14}$ to $5 \times 10^{15}$ ions/cm$^2$ to further form source/drain regions in said device.

57. The method of claim 50, further comprising performing at least one anneal process to activate the dopant material implanted during at least said first and second implant processes.

58. The method of claim 50, further comprising forming a process layer above said gate electrode and said substrate after said first implant process, said second implant process being performed after said process layer is formed.

59. The method of claim 50, further comprising thermally growing a process layer comprised of silicon dioxide above said gate electrode and said substrate after said first implant process, said second implant process being performed after said process layer is formed.

60. The method of claim 1, wherein said second angled implant process is performed after said first angled implant process and prior to any other implant process being performed on said device.

61. The method of claim 1, wherein said second angled implant process is the first implant process performed on said device after said first angled implant process is performed.

62. The method of claim 1, wherein said first angled implant process is performed at an angle ranging from approximately 25–50 degrees.

63. The method of claim 1, wherein said second angled implant process is performed at an angle ranging from approximately 25–50 degrees.

64. The method of claim 1, wherein said first angled implant process is performed at an angle that is greater than the angle at which said second angled implant process is performed.

65. The method of claim 1, wherein said first angled implant process is performed at an angle that is less than the angle at which said second angled implant process is performed.

66. The method of claim 1, wherein said at least one additional implantation process to further form source/drain regions for the device is performed after said second angled implant process.

67. The method of claim 40, wherein said second angled implant process is performed after said first angled implant process and prior to any other implant process being performed on said device.

68. The method of claim 40, wherein said second angled implant process is the first implant process performed on said device after said first angled implant process is performed.

69. The method of claim 40, wherein said first angled implant process is performed at an angle ranging from approximately 25–50 degrees.

70. The method of claim 40, wherein said second angled implant process is performed at an angle ranging from approximately 25–50 degrees.

71. The method of claim 40, wherein said first angled implant process is performed at an angle that is greater than the angle at which said second angled implant process is performed.

72. The method of claim 40, wherein said first angled implant process is performed at an angle that is less than the angle at which said second angled implant process is performed.

73. The method of claim 40, wherein said at least one additional implantation process to further form source/drain regions for the device is performed after said second angled implant process.

74. The method of claim 50, wherein said second angled implant process is performed after said first angled implant process and prior to any other implant process being performed on said device.

75. The method of claim 50, wherein said second angled implant process is the first implant process performed on said device after said first angled implant process is performed.

76. The method of claim 50, wherein said first angled implant process is performed at an angle ranging from approximately 25–50 degrees.

77. The method of claim 50, wherein said second angled implant process is performed at an angle ranging from approximately 25–50 degrees.

78. The method of claim 50, wherein said first angled implant process is performed at an angle that is greater than the angle at which said second angled implant process is performed.

79. The method of claim 50, wherein said first angled implant process is performed at an angle that is less than the angle at which said second angled implant process is performed.

80. The method of claim 50, wherein said at least one additional implantation process to further form source/drain regions for the device is performed after said second angled implant process.

* * * * *